United States Patent [19]

Fujimura et al.

[11] Patent Number: 4,861,424

[45] Date of Patent: Aug. 29, 1989

[54] ASHING PROCESS OF A RESIST LAYER FORMED ON A SUBSTRATE UNDER FABRICATION TO A SEMICONDUCTOR DEVICE

[75] Inventors: Shuzo Fujimura, Towa; Junichi Konno, Kawasaki, both of Japan

[73] Assignee: Fujitsu Limited, Kawasaki, Japan

[21] Appl. No.: 234,134

[22] Filed: Aug. 19, 1988

[30] Foreign Application Priority Data

Aug. 19, 1987 [JP] Japan .................................. 62-203986

[51] Int. Cl.⁴ ......................... B44C 1/22; C03C 15/00; C03C 25/06; B29C 37/00
[52] U.S. Cl. ........................................ 156/643; 134/1; 134/26; 156/646; 156/651; 156/655; 156/668; 204/192.35
[58] Field of Search ............... 156/643, 646, 651, 655, 156/659.1, 668, 345; 204/192.32, 192.35, 192.36; 427/38, 39; 134/1, 26, 30

[56] References Cited

U.S. PATENT DOCUMENTS

| 4,341,594 | 7/1982 | Carlson et al. ................ 156/651 X |
| 4,690,728 | 9/1987 | Tsang et al. ........................ 156/643 |
| 4,789,427 | 12/1988 | Fujimura et al. ................... 156/643 |

Primary Examiner—William A. Powell
Attorney, Agent, or Firm—Staas & Halsey

[57] ABSTRACT

A method for removing a resist layer, in which high doses of ions have been implanted, by etching in a first step and a second step performed sequentially. In the first step, a carbonized region produced in the resist layer due to the high dose ion implantation is etched by applying plasma using hydrogen as a reactive gas at a temperature lower than a softening point of the resist layer. In the second step, a lower region, left after firstly etching the upper region, of the resist layer is etched by a conventional method such as a downstream ashing method or a wet stripping method.

7 Claims, 2 Drawing Sheets

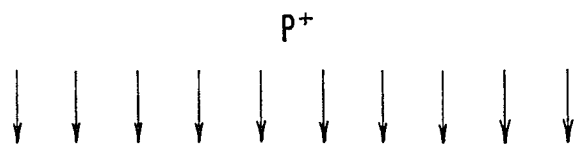
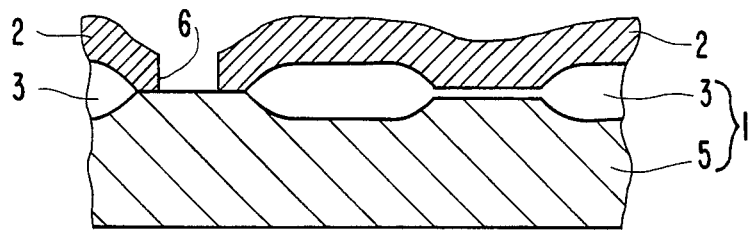
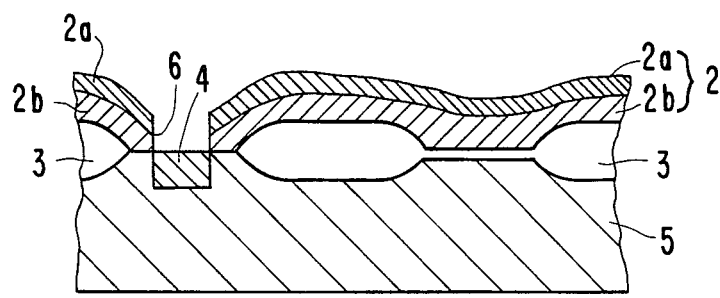
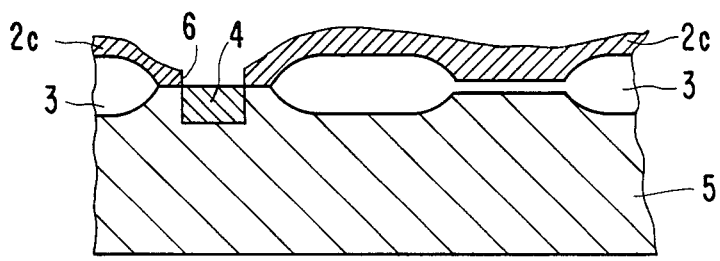
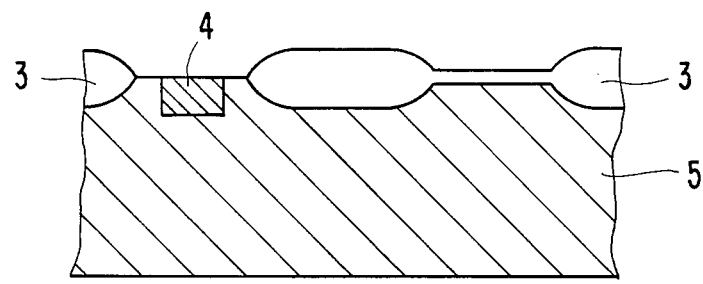

ASHING PROCESS OF A RESIST LAYER FORMED ON A SUBSTRATE UNDER FABRICATION TO A SEMICONDUCTOR DEVICE

BACKGROUND OF THE INVENTION

1. Field of the Invention

The present invention relates to a method of fabricating a semiconductor device and, particularly, to a process of ashing a resist layer including high doses of ions implanted therein, formed on a substrate being in the middle of fabricating a semiconductor device.

2. Description of the Related Art

Generally, in an ion implantation process for fabricating a semiconductor device from a substrate being in the middle of fabricating a semiconductor device, a resist layer made of resin, such as novolak resin, is used as a mask for masking a designated portion of the substrate so as not to be ion-implanted. The resist layer must be removed after the ion implantation is over, for proceeding to the next step of fabricating the semiconductor device. For removing the resist layer, usually, an oxygen plasma etching method performed with no sputtering action, a down stream ashing method carried out in a reactive gas of hydrogen, or a wet stripping method is used. However, when high doses, for example more than $1 \times 10^{14}/cm^2$, of ions are implanted, the high dose ions are also implanted into the resist layer, so that a designated region from the upper surface of the resist layer becomes physically and chemically rigid. This phenomenon is called "carbonization" and the designated region is called a "carbonized region". This carbonization of the resist layer is detailed in a paper entitled "Study on Ashing Process for Removal of Ion Implanted Resist Layer" by five authors including Shuzo Fujimura and Junichi Konno, who are the inventors of the present invention, in proceedings of the symposium on "DRY PROCESS" published by Electronics and Dielectrics and Insulation Divisions of The Electrochemical Society, in 1987.

Because the resist layer is carbonized, the resist layer becomes hard to remove by the usual method mentioned above without damaging the substrate under the resist layer. That is, if a reactive etching method such as an oxygen plasma etching method is applied for removing the resist layer with a strong sputtering action, for example, by using a parallel plate plasma etching apparatus, the resist layer can be ashed even though the resist layer has been carbonized. However, when such strong sputtering is performed on the resist layer, the following problems occur: a problem (first problem) that a surface of the substrate having been under the resist layer is contaminated by residues such as phosphorus pentaoxide ($P_2O_5$) and heavy metal compound produced from the resist layer during the strong sputtering, and another problem (second problem) that lattice defects are generated in a surface region of the substrate by the strong sputtering. Therefore, after removing the resist layer, the residues remained on the substrate must be selectively etched and the etched substrate must be annealed for reforming the lattice defects. Moreover, there is still another problem (third problem) that a designated portion, such as a gate oxide layer of an MOS transistor, previously fabricated in a surface region of the substrate under the resist layer is broken because of stored charge produced on the surface of the substrate during the plasma sputtering. There is no way to solve this third problem.

Thus, when high doses of ions are implanted, because of removing the resist layer, many extra processes must be performed and sometimes a previously fabricated portion of the substrate under the resist layer happens to be damaged. In summary, there are the following problems in the prior art: the cost of the semiconductor device increases; the yield rate of the semiconductor device decreases; the reliability of the products of the semiconductor device decreases; and the freedom for designing the semiconductor device is limited.

SUMMARY OF THE INVENTION

An object of the present invention is to remove a resist layer, in which high doses of ions have been implanted, formed on a substrate being fabricated to a semiconductor device, with simple processes.

Another object of the present invention is to remove the resist layer without damaging the substrate.

Yet another object of the present invention is to decrease the cost of the semiconductor device fabricated through the process of implanting high doses of ions.

Still another object of the present invention is to increase the reliability of the semiconductor device fabricated through the process of implanting the high doses of ions.

Another object of the present invention is to increase the yield rate of the products of the semiconductor device fabricated through the process of implanting the high doses of ions.

The above objects are accomplished by removing the resist layer with the following two steps, assuming that the resist layer is divided into two regions such as an upper region including the carbonized region and a lower region attached to the substrate: a step for removing the upper region by a plasma etching method carried out with a mixing gas of nitrogen and an active gas of hydrogen and a step for removing the lower region by using the prior art down stream sputtering method or wet stripping method. Applying the plasma etching method to the upper region with the mixing gas, each bond for tightly bonding the implant with carbon in the carbonized region, for example, a phosphorus-carbon (P-C) bond can be broken and produced to an implant hydride, and the implant hydride is volatalized at a room temperature. In the above steps, the volatalization is particularly important for leaving almost no residue on the substrate after removing the resist layer, furthermore, a fact that the volatalization can be performed at the room temperature is effective to simply carry out the processes for removing and after removing the resist. Applying the present invention, the cost of the semiconductor device can be decreased, the yield rate of the semiconductor device can be increased, the reliability of the products of the semiconductor device can be increased, and the semiconductor device can be designed without considering the problem associated with high dose ion implantation.

BRIEF DESCRIPTION OF THE DRAWINGS

FIG. 1(a) is a partial cross-sectional view of a silicon substrate having oxide films in a surface region thereof, on which a resist layer is coated, for illustrating a step of selective phosphorus ion implantation;

FIG. 1(b) is a partial cross-sectional view of the silicon substrate coated by the resist layer, for illustrating a carbonized region formed in a surface region of the resist layer because of implanting high doses of phosphorus ions into the resist layer;

FIG. 1(c) is a partial cross-sectional view of the silicon substrate for illustrating a step of etching an upper region, including the carbonized region, of the resist layer by plasma etching;

FIG. 1(d) is a partial cross-sectional view of the silicon substrate for illustrating a step of removing a lower region of the resist layer by a downstream ashing method.

DETAILED DESCRIPTION OF THE PREFERRED EMBODIMENTS

Figure 2:
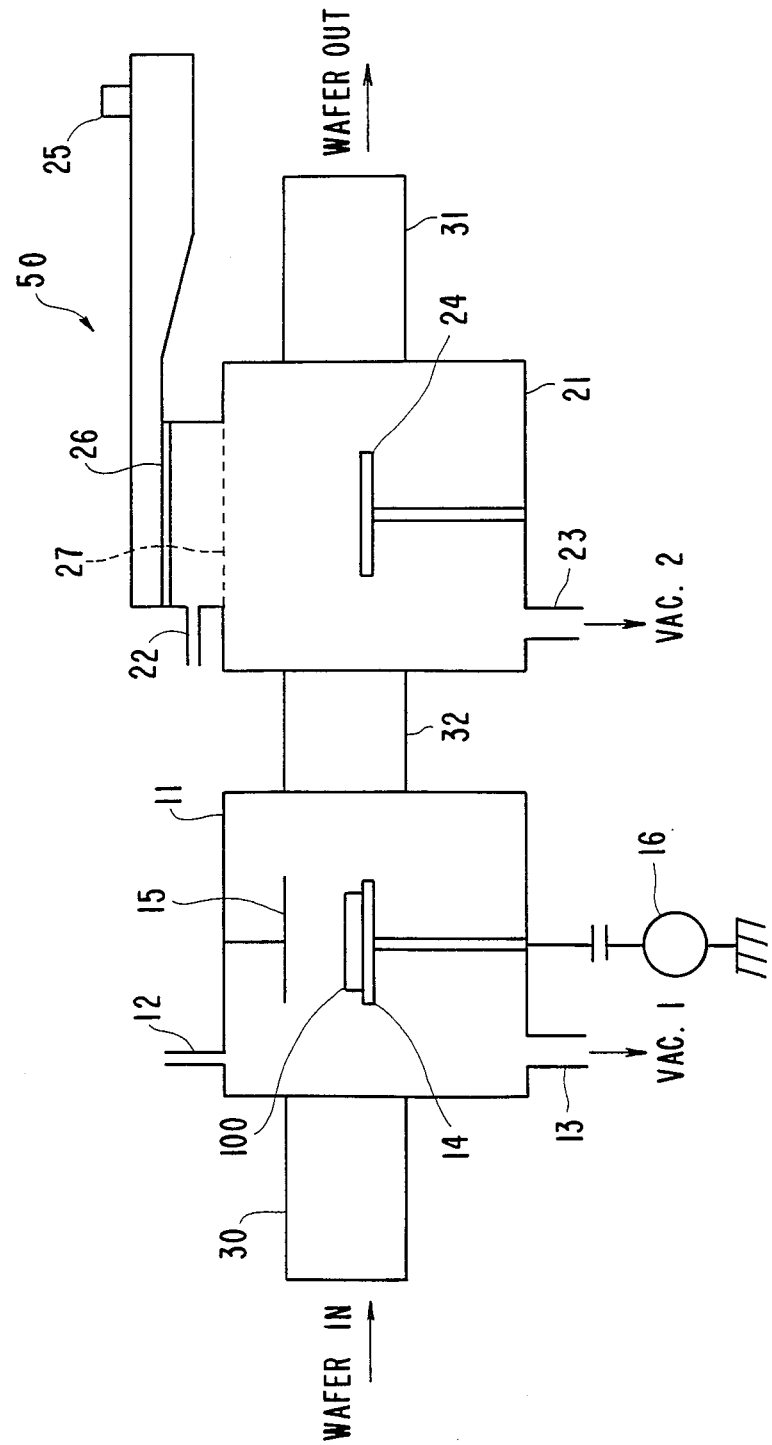
FIG. 2 is a schematic diagram of an etching apparatus used in the ashing process, embodying the present invention, of the resist layer.

An embodiment of the present invention will be described with reference to FIGS. 1(a) to 1(d), in which cross-sectional views of semi-processed semiconductor devices are shown for illustrating the successive steps of the present invention.

In FIG. 1(a), photoresist (HPR 204; FUJI-HUNT) mainly made of novolak resin, is coated on a substrate 1 by a spinner so as to form a resist layer 2 having a thickness of about two microns. The resist layer 2 is patterned by photolithography to form openings 6 for implanting high doses of ions into a silicon substrate 5. In this embodiment, the substrate 1 consists of a silicon substrate 5 and oxide layers 3 formed in a surface region of the silicon substrate 5.

In FIG. 1(b), high doses, $1 \times 10^{16}$ cm$^{-2}$, of phosphorus ions are implanted into the silicon substrate 5 at an energy of 70 KeV (kilo electron voltage) for forming phosphorus implanted regions 4 in the silicon substrate 5 at the openings 6 of the resist layer 2. One opening 6 is shown in FIGS. 1(a) to 1(d) and one implanted region 4 is indicated in FIGS. 1(b) to 1(d) at the opening 6, respectively. When the high dose phosphorus ions are thus implanted into the silicon substrate 5, the high dose phosphorus ions are also implanted into the resist layer 2, which results in producing a carbonized region 2a, leaving an uncarbonized region 2b, as shown in FIG. 1(b). In this case, the thickness of the carbonized region 2a is from 0.2 micron to 0.3 micron. This carbonized region 2a causes problems in the prior art as explained before.

In the next step, the resist layer 2 is removed, and in the present invention, this removement is performed in two steps for individually removing the carbonized region 2a and the uncarbonized region 2b by using a resist ashing apparatus 50. FIG. 2 shows a schematic illustration of the resist ashing apparatus 50. As shown in FIG. 2, the resist ashing apparatus 50 consists of a cathode-coupled parallel plate plasma ashing chamber 11, which will be simply called a "plasma ashing chamber 11" hereinafter, for removing the carbonized region 2a, a downstream ashing chamber 21 for removing the uncarbonized region 2b, and load blocks 30, 31 and 32. The load block 30 is for introducing a wafer to the plasma ashing chamber 11 from outside the resist ashing apparatus 50. The load block 32 is for transferring the wafer from the plasma ashing chamber 11 to the downstream ashing chamber 21. The load block 31 is for outputting the wafer from the downstream ashing chamber 21 to the outside. The term "wafer" is used to indicate a substance such as a silicon wafer divided into a plurality of the semi-processed devices on each of which the resist layer is formed.

In the plasma ashing chamber 11, a plasma is confined between a power electrode 15 and a table 14 on which a wafer 100 is placed. On the wafer 100, a plurality of the semi-processed devices in the step shown in FIG. 1(b) are being processed. Temperature of the wafer 100 can be controlled by a heater and a cooler (not shown in FIG. 2) attached to the table 14, as will be explained below. RF (radio frequency) power at 13.56 MHz is delivered to the plasma from a power source 16. It is important to keep the temperature of the wafer 100 lower than a softening point (about 120° C.) of the resist layer 2. Otherwise, if the temperature were raised higher than the softening point, the uncarbonized region 2b would be softened during etching of the carbonized region 2a, so that the carbonized region 2a becomes cracked and torn into many pieces. Some of the pieces could then sink in the softened uncarbonized region 2b. As a result, the residues obtained from the plasma etching of the carbonized region 2a are left at the bottom of the uncarbonized region 2b and sticked on the upper surface of the substrate 1, unless the residues are etched off by the plasma. If the plasma etching is applied to the uncarbonized region 2b, the same problem associated with known methods would occur.

A mixing gas composed of 97 percent nitrogen and 3 percent hydrogen in volume is used in the plasma ashing chamber 11 as a reactive gas so at a pressure of about 0.5 Torr. The mixing gas is introduced into the plasma ashing chamber 11 through an inlet 12 and exhausted from the plasma ashing chamber 11 through an outlet 13, using an evacuating system Vac. 1 (not shown in FIG. 2).

When the plasma etching is performed onto the resist layer 2 formed on the wafer 100, in other words, formed on the substrate 1 with the mixing gas in the plasma ashing chamber 11, an upper region, having 1 micron in thickness, of the resist layer 2 is etched off. Thus the carbonized region 2a is completely etched, leaving a lower region 2c of the resist layer 2, as shown in FIG. 1(c).

After removing the carbonized region 2a, the lower region 2c is removed in the next process step. In the next step, the wafer 100 on the table 14 in the plasma ashing chamber 11 is transferred to a table 24 in the downstream ashing chamber 21 through the load block 32 without breaking vacuum, and the lower region 2c is removed in the downstream ashing chamber 21, applying a downstream ashing method.

In the downstream ashing chamber 21, a microwave plasma is generated by a magnetron source 25 oscillating RF at 2.45 GHz and confined in a space between a window 26 and a shower head 27. Meanwhile, a mixing gas composed of 97 percent (in volume) oxygen and 3 percent tetrafluoromethane is introduced through an inlet 22 and exhausted to an evacuating system Vac. 2 (not shown in FIG. 2) through an outlet 23. Consequently, the wafer 100 is etched in a space between the shower head 27 and the table 24 filled with oxygen and other gas species being neutral in an atomic state. This kind of etching is called a downstream ashing by which the lower region 2c is completely removed as shown in FIG. 1(d). The power required to perform the down stream ashing is lower, compared with that of the plasma ashing performed in the chamber 11, so that no problem occurs in the substrate 1 as done in the prior art.

There is another method for etching the lower region 2c, called a wet stripping method. However, when the wet stripping method is applied to the second step, the substrate 1 must be taken out of chamber 11, breaking the vacuum, after the plasma etching of the upper region 2a.

Because of applying the present invention for removing the resist layer 2, almost no residue is left on the surface of the substrate 1. For evaluating how the resist layer 2 is removed, a particle counter for counting the number of the residues, such as phosphorus oxides, heavy metals and carbon compounds, remained on the surface of the substrate 1 is used. When the residues are limited so that only residues each having diameter larger than 100 micron are counted, the number of residues is 300 to 350 per 4-inch wafer. This value is very small, compared with the residues number for known methods. That is, when the conventional oxygen plasma etching method is applied for removing the resist layer 2, the residue number is about 8000 per 4-inch wafer. It is clear that the present invention provides a remarkable improvement in removing the ion-implanted resist layer.

Although the ashing process of the present invention generates a few of lattice defects, the lattice defects can be eliminated by annealing the substrate 1 at a temperature higher than 400° C.

What is claimed is:

1. A method for removing a resist layer formed on a substrate, said resist layer including an ion-implanted region, expanded from an upper surface of the resist layer, in which high doses of ions are implanted, said method comprising the steps of:

removing a first region including the ion-implanted region, by a first etching step performed by a plasma discharge process requiring a relatively high amount of power, using hydrogen as a reactive gas, leaving a second region, said first region and said second region forming the resist layer; and removing the second region by a second etching step being performed by a process requiring less power than the plasma discharge process.

2. A method according to claim 1, wherein said second etching step is downstream etching.

3. A method according to claim 1, wherein said second etching is by a wet stripping process.

4. A method according to claim 1, wherein said first etching step is performed at a temperature lower than a softening point of the resist layer.

5. A method according to claim 1, wherein said step of removing the first region is performed using a mixed gas including said hydrogen and an inert gas.

6. A method according to claim 1 further comprising a step of annealing the substrate at a temperature higher than 400° C., after removing the resist layer.

7. A method according to claim 5, wherein said first etching step is performed in a parallel plate plasma etching chamber filled with the mixed gas.

* * * * *